(12) United States Patent
Jansson (10) Patent No.: US 6,278,338 B1
(45) Date of Patent: Aug. 21, 2001

(54) CRYSTAL OSCILLATOR WITH PEAK DETECTOR AMPLITUDE CONTROL

(75) Inventor: Lars Gustaf Jansson, Long Island, ME (US)

(73) Assignee: Silicon Wave Inc., San Diego, CA (US)

( * ) Notice: Subject to any disclaimer, the term of this patent is extended or adjusted under 35 U.S.C. 154(b) by 0 days.

(21) Appl. No.: 09/562,835

(22) Filed: May 1, 2000

(51) Int. Cl.[7] .................................. H03B 5/36; H03L 5/00
(52) U.S. Cl. ..................................... 331/116 FE; 331/109; 331/158; 331/160; 331/183; 331/186
(58) Field of Search ................................. 331/109, 116 R, 331/116 FE, 117 R, 117 FE, 158, 160, 161, 182, 183, 185, 186

(56) References Cited

U.S. PATENT DOCUMENTS

| | | | |
|---|---|---|---|
| 3,982,210 | * | 9/1976 | Gehrke ................................. 331/109 |
| 4,387,349 | * | 6/1983 | Rapp ............................. 331/116 FE |
| 4,430,627 | * | 2/1984 | Machida ................................. 331/109 |
| 4,578,650 | * | 3/1986 | Watson ................................. 331/160 |
| 4,588,968 | * | 5/1986 | Wile ..................................... 331/109 |
| 4,609,884 | * | 9/1986 | Kindinger et al. .................... 331/109 |
| 4,833,427 | * | 5/1989 | Leuthold et al. ..................... 331/165 |
| 4,999,588 | * | 3/1991 | Koch .................................... 331/109 |
| 5,034,706 | * | 7/1991 | Betti et al. ....................... 331/117 R |
| 6,064,277 | * | 5/2000 | Gilbert ............................ 331/117 R |
| 6,091,307 | * | 7/2000 | Nelson ................................. 331/109 |

OTHER PUBLICATIONS

Vittoz, et al., "CMOS Analog Integrated Circuits Based on Weak Inversion Operation", IEEE Journal of Solid–State Circuits, vol. SC–12, No. 3, Jun. 1977. pp. 224–231.

John A.T.M. van den Homberg, "A Universal 0.03mm$^2$ One–Pin Crystal Oscillator in CMOS", IEEE Journal of Solid–State Circuits, vol. 34, No. 7, Jul. 1999. pp 956–961.

* cited by examiner

Primary Examiner—David Mis
(74) Attorney, Agent, or Firm—Jaquez & Associates; Martin J. Jaquez, Esq.; Allan Y. Lee, Esq.

(57) ABSTRACT

A crystal oscillator apparatus is described that has a wide dynamic frequency range and that is capable of supporting a broad range of crystal types. The present invention reduces the unwanted side effects that are associated with the prior art crystal oscillator designs, such as the clipping of signals, the introduction of signal distortion and unwanted signal harmonics. The present invention reduces the total wasted loop gain of the oscillator while also reducing the amount of integrated circuit real estate required to implement the crystal oscillator. The crystal oscillator apparatus of the present invention preferably comprises a crystal resonator circuit, an inverting amplifier, a bias circuit, a reference circuit, and a peak detector circuit. The present invention takes advantage of Automatic Gain Control (AGC) design techniques. The gain of the present crystal oscillator is automatically regulated using a closed loop circuit design. The present invention advantageously utilizes a peak detector circuit in combination with a reference circuit. The peak detector compares a reference signal with an amplified and inverted oscillation signal produced by a crystal resonator, and generates a feedback signal as a result of the comparison. The feedback signal controls a bias circuit that, in turn, controls the amplified inverted oscillation signal. The preferred embodiment of the present invention preferably comprises MOSFETs, resistors and capacitors implemented on a single integrated circuit device. By implementing the present inventive crystal oscillator on a single integrated circuit device, the deleterious effects introduced by temperature variations are advantageously reduced or nullified.

21 Claims, 6 Drawing Sheets

CRYSTAL OSCILLATOR WITH PEAK DETECTOR AMPLITUDE CONTROL

BACKGROUND OF THE INVENTION

1. Field of the Invention

This invention relates to crystal oscillators and more particularly to crystal oscillators having peak detector amplitude control to accommodate a wide dynamic range of frequencies and a wide range of crystal specifications.

2. Description of Related Art

Oscillators, clocks and timers are essential to the performance of most modem electronic devices. Examples of devices that use oscillators, clocks and timers are commonplace. Digital timepieces (e.g., digital wristwatches), computers, videocassette recorders, televisions, cordless telephones and wireless communication devices (e.g., cellular phones, pagers and Internet-enabled personal digital assistants (PDAs)) all use timers to generate internal clock signals used by the devices. As is well known, timers and clocks typically use crystal oscillators to derive desired clockrate signal for use by electronic devices. Crystal oscillators are also utilized in electronic communication and navigation systems to establish transmitting and receiving operating frequencies.

Figure 1:
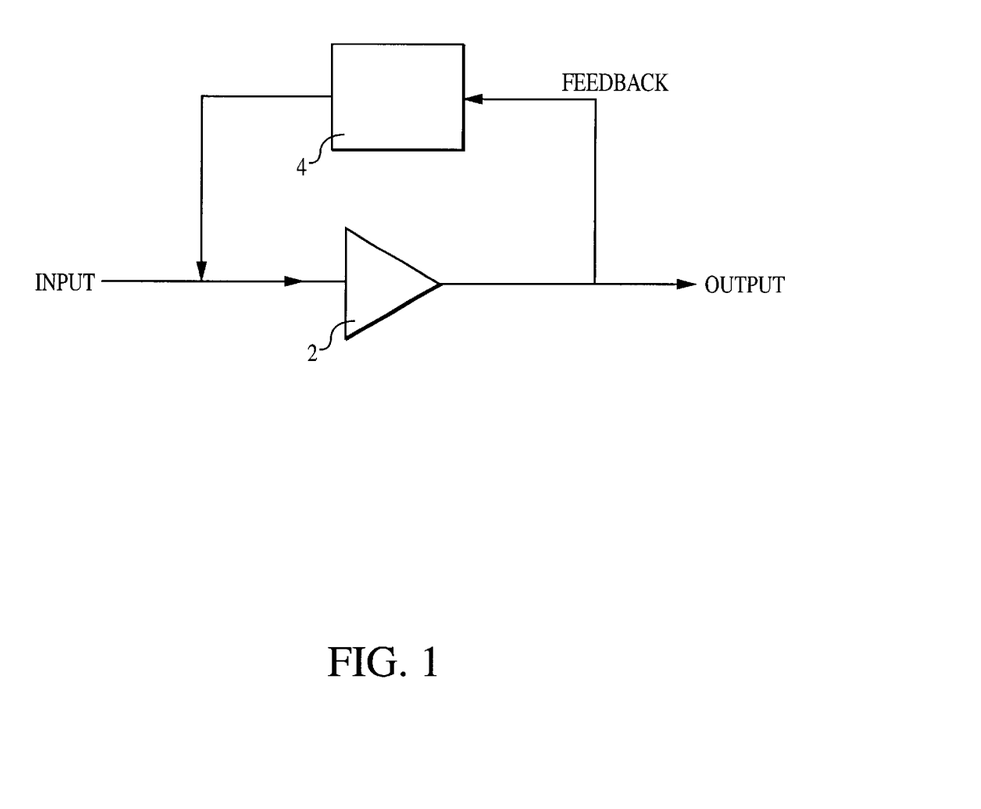
FIG. 1 shows a block diagram of a typically basic oscillator circuit.

A typical basic oscillator circuit is shown in FIG. 1 in block diagram form. Basic oscillators sustain oscillation signals using a closed-loop feedback system that is now described. The basic oscillator is designed to produce a continuous sine wave signal (i.e., oscillating signal) having an associated signal frequency. The associated signal frequency is determined by certain properties of the feedback network shown in FIG. 1. As shown in FIG. 1, the basic oscillator typically comprises an inverting amplifier 2 and a feedback network 4. The inverting amplifier 2 receives an input from a bias source (not shown). The inverting amplifier 2 outputs an amplified and inverted signal to an input of the feedback network 4 and to an output. The feedback network 4 outputs a feedback signal to the input of the inverting amplifier 2 and thus completes the closed-loop feedback system. An oscillator must meet certain criteria to operate properly.

Typically, a basic oscillator circuit must meet two design criteria to function properly. First, the oscillator's total loop gain ("T") must be equal to 1. Second, the oscillator's total phase shift must be equal to 0. The total loop gain T is the amplifier gain ("a") multiplied by the feedback gain ("f"). The value of the feedback gain is less than one. The amplifier gain ("a") represents the ratio of the output voltage versus the input voltage of the inverting amplifier 2 shown in FIG. 1. The total phase shift is the phase of the inverting amplifier 2 and the phase of the feedback network 4. The total phase shift can be represented mathematically as: arg(af)=0, where arg(af) is the phase angle of (af) in radians.

After initialization, an oscillator signal's amplitude grows steadily until reaching steady state. Steady state is achieved through a mechanism that limits the loop gain. Two mechanisms for limiting loop gain are "gain-limiting" in the amplifier element (in the form of non-linearities intrinsic to the device or clipping) or regulating gain in the circuit (in the form of amplitude regulation or AGC control methods). If loop gain is not limited, the amplitude grows infinitely. Under real world conditions, the initial loop gain must be greater than 1 to insure reliable oscillation operation. Typically, most oscillators have an initial loop gain value between 2 and 3. At steady state the amplitude of the oscillation amplitude reaches equilibrium (i.e., neither increases nor decreases) because the loop gain has reached equilibrium. Upon reaching steady state (i.e., stable oscillation), the total loop gain can be represented mathematically as: |af|=1.

Figure 2A:
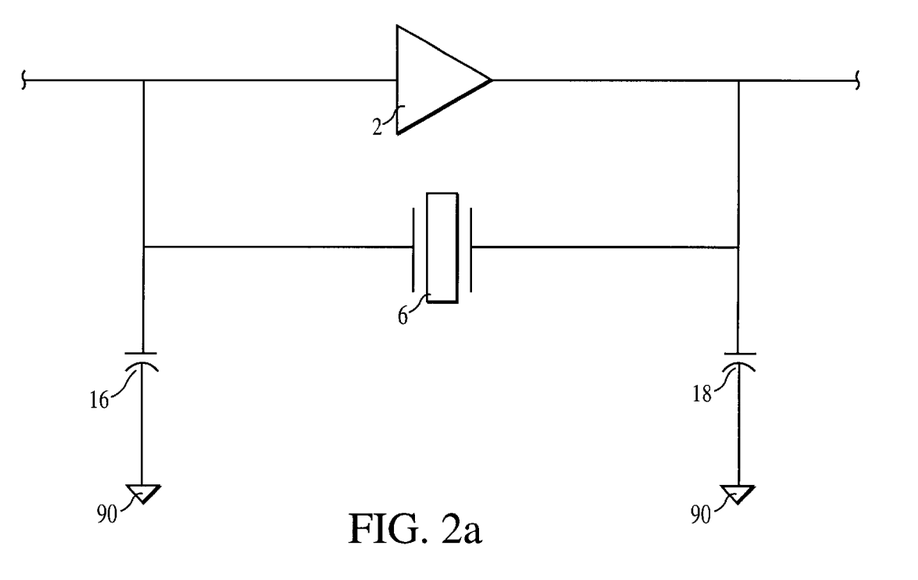
FIG. 2a is a simple schematic diagram of a Pierce oscillator.

As is well known in the electronics art, crystal oscillators utilize crystals to generate an oscillating signal. One type of crystal oscillator circuit that is well-known to those skilled in the oscillator design art is a "Pierce oscillator". A simplified schematic diagram of a Pierce oscillator is shown in FIG. 2a. A Pierce oscillator typically comprises an inverting amplifier 2, a crystal 6, a first capacitor 16 and a second capacitor 18. As shown in FIG. 2a, the inverting amplifier 2 and the crystal 6 are coupled in a shunt configuration having two nodes. The capacitors 16, 18 each have two nodes. One node of the capacitor 16 is coupled to a first node of the shunt configuration. The other node of the capacitor 16 is coupled to a common ground 90. Similarly, one node of the capacitor 18 is coupled to a second node of the shunt configuration. The other node of the capacitor 18 is coupled to the common ground 90. As before, the inverting amplifier 2 has an amplifier gain "a". The crystal 6 and capacitors 16 and 18 are analogous to the feedback network 4 of FIG. 1. The crystal loss can best be described by modeling the crystal 6 using an electrical equivalent.

Figure 2B:
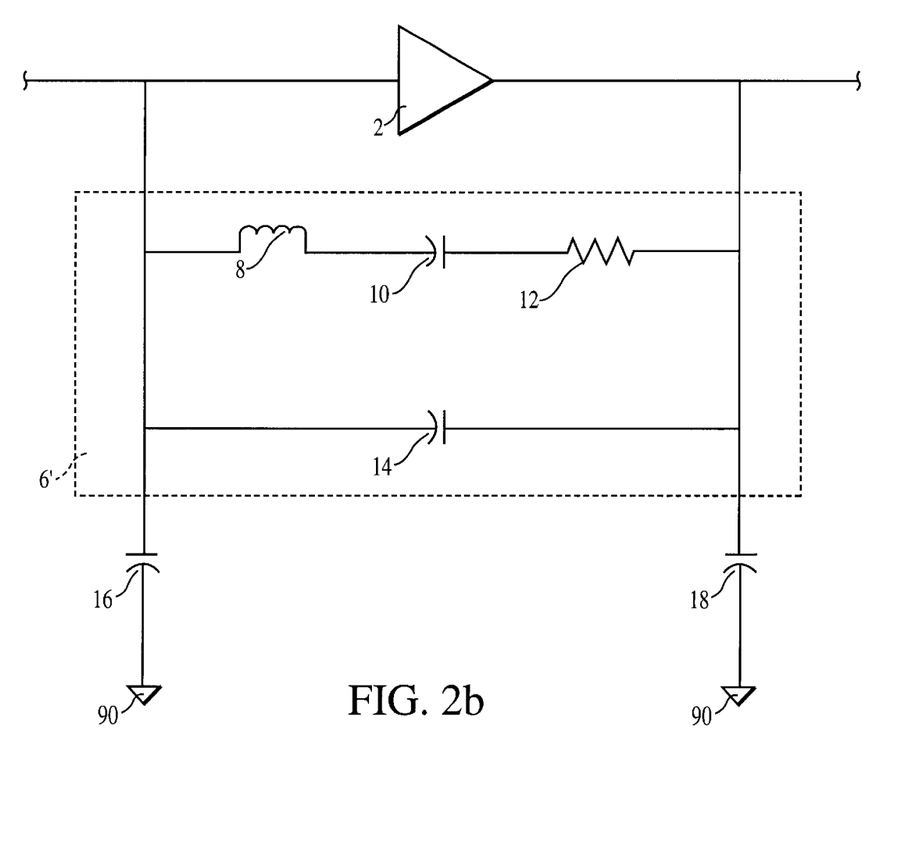

The crystal 6 can be modeled by an electrical equivalent comprising an inductor, a capacitor, a resistor and a shunt capacitor. The Pierce oscillator of FIG. 2a is now described using a crystal model of the crystal 6. FIG. 2b is a simple schematic diagram of an electrical equivalent of the Pierce oscillator of FIG. 2a. The electrical comprises an inverting amplifier 2, a crystal model 6', a capacitor 16 and a capacitor 18. The Pierce oscillator representation of FIGS. 2a and 2b are substantially similar and thus common components are not described in detail herein. As shown in FIG. 2b, the crystal model 6' comprises an inductor 8, a capacitor 10, a resistor 12 and a capacitor 14. The inductor 8, capacitor 10 and resistor 12 are coupled in series as shown. The capacitor 14 is coupled to the series network in a shunt configuration.

In the crystal oscillator of FIG. 2b, the resistor 12 represents the Equivalent Series Resistance (ESR) of the crystal 6 of FIG. 2a. The loss of the crystal is represented by the ESR. As described above with reference to FIG. 1, a crystal oscillator must meet two criteria to function properly. First, the total loop gain ("T") of the oscillator must equal 1. The total loop gain T is the amplifier gain ("a") multiplied by the by the feedback circuit formed by crystal 6 and capacitors 16, 18. The total loop gain, T, can be represented mathematically as: |af|=1. Second, the total phase shift of the oscillator must equal 0. In the Pierce oscillator of FIGS. 2a and 2b, the total phase shift is the phase of the inverting amplifier 2, taken together with the phase of the crystal 6 (or 6' of FIG. 2b). In the Pierce oscillator the arg(a)=−180 and the arg(f)=−180. Thus, the total phase shift can be represented mathematically as: arg(af)=0, where arg(af) is the phase angle of (af) in radians.

The Pierce oscillator of FIGS. 2a and 2b initially operates by first applying a bias such that the total loop gain, T, (i.e., af) is greater than 1. As the amplitude of the output of the inverting amplifier 2 increases, the gain of the amplifier, "a" is reduced by limiting non-linearities within the inverting amplifier 2 until a steady-state of T=af=1 occurs. Two disadvantages are associated with the technique of limiting non-linearities in the amplifier.

One disadvantage is the introduction of unwanted side effects such as the clipping of signals, distortion and harmonics (harmonics lead to unwanted signal radiation that interferes with other signals). A second disadvantage of limiting non-linearities in the inverting amplifier is a waste of total loop gain. The total loop gain is wasted because a large amount of current must be supplied to the oscillator to ensure that the initial loop gain is greater than 1 for initialization, while the non-linearities limit the oscillation signal by distorting the amplifier. The non-linearities reduce the initial loop gain from a value greater than 1 to a steady state (or large signal) loop gain equal to 1. Other methods of oscillator design have been attempted using amplitude regulation instead of limiting non-linearities to produce oscillation signals without introducing the unwanted side effects described above.

Some methods of crystal oscillator design have been attempted whereby the total loop gain of the basic crystal oscillators are regulated using Automatic Gain Control (AGC) or amplitude regulation techniques. One such crystal oscillator having amplitude regulation is described in more detail in an article by Eric Vittoz and Jean Fellrath, entitled "CMOS Analog Integrated Circuits Based on Weak Inversion Operation", appearing in the IEEE Journal of Solid-State Circuits, Vol. SC-12, No. 3, published in June 1977, and hereby incorporated by reference herein for its teachings on crystal oscillators. Crystal oscillators having amplitude regulation (or AGC) operate by lowering the input current (i.e., the bias current) until a steady state is achieved. The term AGC (Automatic Gain Control) derives from the operation of the circuit because the gain of the circuit is automatically controlled through a closed-loop regulation technique. Because these type of oscillators use lowered bias currents, the disadvantages associated with the prior art Pierce oscillators described above are overcome because large signals are not produced. Specifically, the total loop gain of the oscillator is not wasted and the unwanted side effects such as clipping, distortion and harmonics are reduced. An exemplary crystal oscillator using amplitude regulation is now described.

Figure 3:
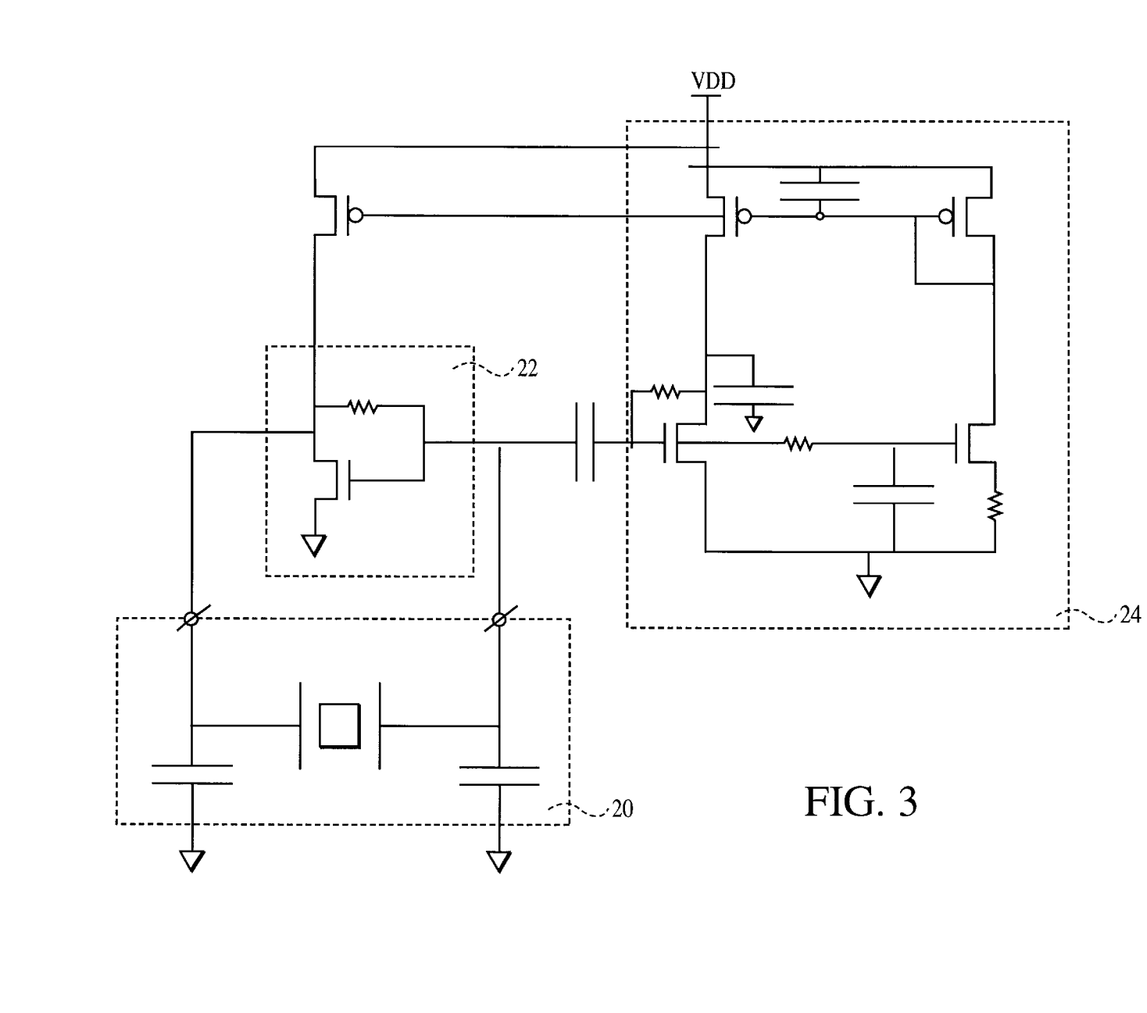
FIG. 3 is a schematic of a crystal oscillator circuit having an amplitude regulation circuit.

FIG. 3 is a schematic of a crystal oscillator circuit having an amplitude regulation circuit. The circuit detail and AGC operation of FIG. 3 is described in more detail in the Vittoz article that has been incorporated by reference and is therefore not be described in more detail herein. As shown in FIG. 3, the crystal oscillator comprises a crystal resonator 20, an inverting amplifier 22 and an amplitude regulation circuit 24. The crystal resonator 20 and the inverting amplifier 22 are analogous to the feedback network 4 and the inverting amplifier 2 of FIG. 1, respectively. The amplitude regulation circuit 24 detects the amplitude of the oscillation signal, limits the total loop gain of the oscillator and lowers the bias current until the oscillator reaches a steady state.

One disadvantage associated with crystal oscillators having amplitude regulation as shown in FIG. 3 is that the amplitude regulation circuit 24 is specifically designed for only one particular frequency or crystal type. For example, one common frequency and crystal type is the 32.768 kHz crystal frequency commonly used in the digital watch industry. Thus, the crystal oscillator's dynamic range (i.e., the range of frequencies that the oscillator can accommodate) is limited by the use of amplitude regulation. Due to the operation of the amplitude regulation circuit, the oscillator can accommodate only a very narrow range of crystal types. Another disadvantage of the crystal oscillator described above and shown in FIG. 3 is introduced by the use of filters or capacitors. Specifically, three filters (i.e., a large capacitor and two smaller capacitors) are necessitated by the circuit design of FIG. 3. These filters add considerable size to the integrated circuit "real estate" or "chip area" (i.e., the amount of area a component such as a crystal oscillator requires on an integrated circuit consumed by the crystal oscillator).

Therefore, the need exists for a crystal oscillator apparatus that reduces the production of unwanted side effects such as the clipping of signals, distortion and harmonics. Further, the need exists for a crystal oscillator design that reduces total loop gain waste. Also, the need exists for a crystal oscillator apparatus that has a wide dynamic range (i.e., can accommodate a wide frequency range), and can support a broad range of crystal types. In addition, the need exists for a crystal oscillator apparatus that allows an initial bias current to be applied that can be very large yet that will not overdrive the crystal oscillator circuit and create excess signal harmonics. The need exists for a crystal oscillator apparatus that allows for large variations in Q and therefore permits use of low cost crystal resonators. The need exists for a crystal oscillator apparatus that includes means for controlling the amplitude of the oscillation signal produced by the crystal oscillator, thereby reducing the possibility of overdriving the crystal resonator, and consequently increasing the reliability of the crystal oscillator apparatus. Furthermore, a need exists for a crystal oscillator design that achieves the above-stated objects yet consumes less chip area as compared with the prior art crystal oscillator approaches. The present invention provides such a crystal oscillator apparatus.

SUMMARY OF THE INVENTION

The crystal oscillator apparatus of the present invention provides an oscillator that has a wide dynamic range and can support a broad range of crystal types. Further, the present invention reduces the production of undesired side effects such as the clipping of signals, introduction of signal distortions and the introduction of harmonic signals. In addition, the present invention reduces the total loop gain waste and the consumption of integrated circuit real estate required to implement crystal oscillator circuits.

The crystal oscillator apparatus of the present invention preferably comprises a crystal resonator circuit, an inverting amplifier, a bias circuit, a reference circuit, and a peak detector circuit. The present invention takes advantage of Automatic Gain Control (AGC) design techniques. The gain of the present crystal oscillator is automatically regulated using a closed loop circuit design. In accordance with the present invention, the peak detector compares a reference signal with an amplified and inverted oscillation signal produced by the crystal resonator, and generates a feedback signal as a result of the comparison. The feedback signal is used to control a bias circuit that, in turn, controls the amplified inverted oscillation signal generated by the inverting amplifier. The peak detector continuously compares the reference signal with the amplified and inverted oscillation signal until the crystal oscillator achieves a steady state of operation.

The present invention advantageously provides a crystal oscillator having a wide dynamic range and capable of supporting a broad range of crystal types. The preferred embodiment of the present invention preferably comprises MOSFETs, resistors and capacitors. The preferred embodiment of the present invention advantageously reduces the deleterious effects that can be caused by temperature changes occurring in the device. In addition, the inventive crystal oscillator reduces risks of overdriving the crystal resonator and thereby producing undesirable signal harmonics. Variations in crystal Q can therefore be very large, advantageously permitting use of low cost crystals. Furthermore, by controlling the amplitude of the oscillation signal generated by the crystal oscillator, the reliability of the crystal oscillator is also increased.

The details of the preferred and alternative embodiments of the present invention are set forth in the accompanying drawings and the description below. Once the details of the invention are known, numerous additional innovations and changes will become obvious to one skilled in the art.

BRIEF DESCRIPTION OF THE DRAWINGS

FIG. 2b is a simple schematic diagram of an electrical equivalent of the Pierce oscillator of FIG. 2a.

Like reference numbers and designations in the various drawings indicate like elements.

DETAILED DESCRIPTION OF THE INVENTION

Throughout this description, the preferred embodiment and examples shown should be considered as exemplars, rather than as limitations on the present invention.

The crystal oscillator apparatus of the present invention provides an oscillator that has a wide dynamic range and can support a broad range of crystal types. Further, the present invention reduces the production of unwanted side effects such as the clipping of signals, and the introduction of signal distortion and harmonics. In addition, the present invention reduces the total loop gain waste and the chip area that must be allocated for the oscillator design.

The crystal oscillator apparatus of the present invention preferably comprises a crystal oscillator, a peak detector and a reference circuit. The gain of the oscillator is automatically regulated using a closed loop circuit design. The present invention advantageously utilizes a peak detector and a reference circuit that allows the crystal oscillator to have a wide dynamic range and to support a broad range of crystal types. Two embodiments of the crystal oscillator apparatus of the present invention are described herein. It will be obvious to one skilled in the crystal oscillator apparatus art that alternative crystal oscillators may be used without departing from the spirit and scope of the present invention.

Figure 4:
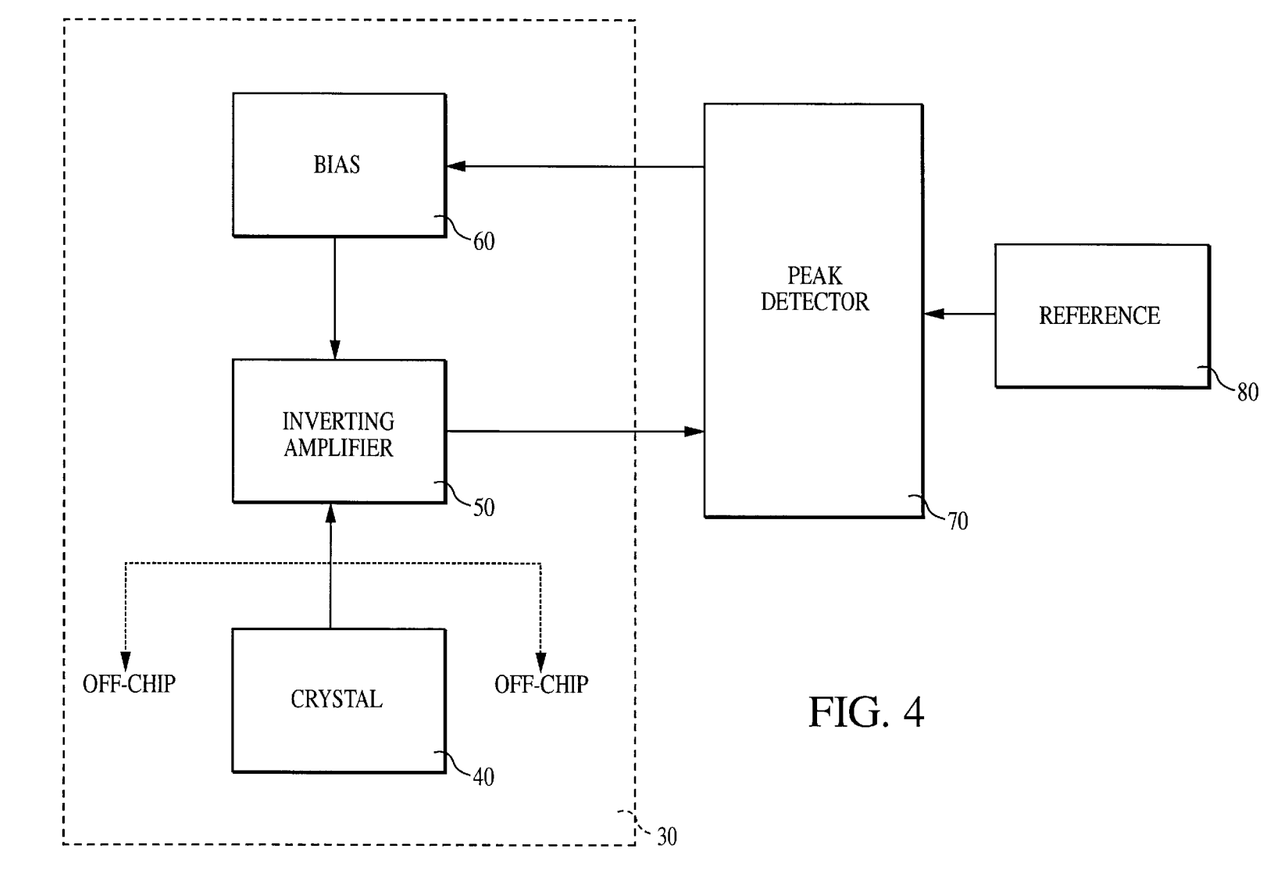
FIG. 4 is a simplified block diagram of the preferred embodiment of the present crystal oscillator apparatus.
Figure 5:
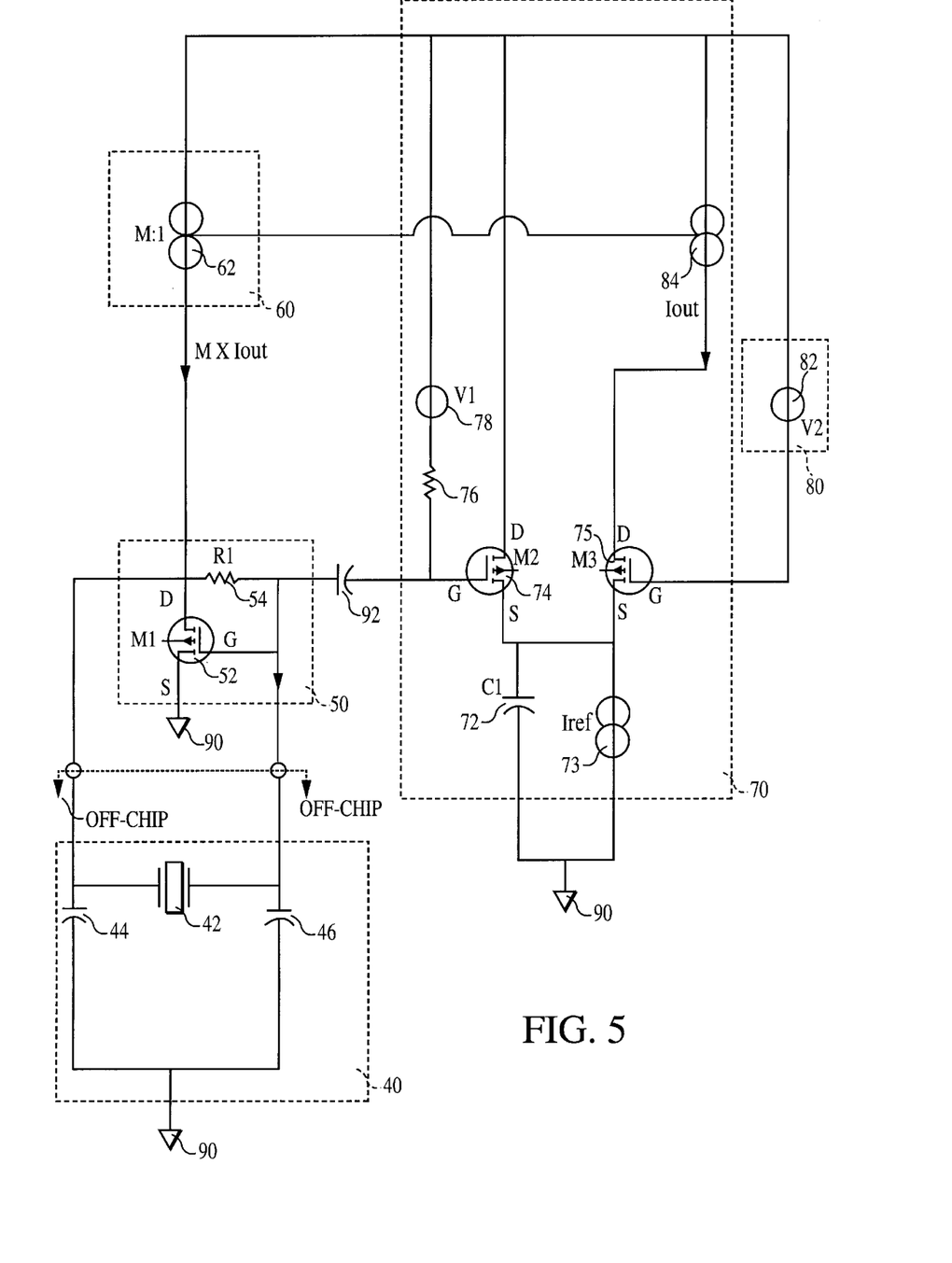
FIG. 5 is a more detailed schematic diagram of the crystal oscillator apparatus of FIG. 4.

FIGS. 4 and 5 show a preferred embodiment of the present invention. FIG. 4 is a block diagram of the preferred embodiment of the present crystal oscillator apparatus. The first preferred embodiment of the present invention is preferably fabricated using solid-state integrated circuit (IC) devices such as large scale integrated (LSI) devices, very large scale integrated (VLSI) devices, or application specific integrated circuit (ASIC) devices. However, this is not meant to be a limitation to the present invention as one skilled in the crystal oscillator art shall recognize that other methods of fabrication can be used without departing from the spirit and scope of the present invention.

As shown in FIG. 4, the present inventive crystal oscillator comprises a crystal oscillator 30, a peak detector 70 and a reference circuit 80. The crystal oscillator 30 comprises a crystal 40, an inverting amplifier 50 and a bias circuit 60. In the preferred embodiment, the inverting amplifier 50, the bias circuit 60, the peak detector 70 and the reference circuit 80 are constructed on a single integrated circuit device. The crystal 40 is preferably fabricated as a separate device, "off-chip" from the other components (i.e., not on the same integrated circuit device as the amplifier 50, bias circuit 60, peak detector 70 and reference circuit 80). Advantageously, this design allows the present invention to readily utilize various types of crystals and thereby accommodate various crystal types. Different crystals 40 can be used with the crystal oscillator circuit of FIG. 4 simply by changing the crystal 40 that is provided as input to a single integrated circuit device. Alternatively, the crystal 40 can be designed to co-exist with the other circuit components of FIG. 4. Those skilled in the integrated circuit device design art shall recognize that the crystal oscillator apparatus of the present invention can be designed with the crystal 40 being fabricated on the single integrated circuit device (i.e., crystal is designed to reside "on-chip").

Referring again to FIG. 4, the crystal 40 outputs an oscillation signal to a first input of the inverting amplifier 50. The bias circuit 60 outputs a bias signal to a second input of the inverting amplifier 50. The inverting amplifier 50 outputs an inverted amplified oscillation signal to a first input of the peak detector circuit 70. The reference circuit 80 outputs an output signal to a second input of the peak detector 70. The peak detector 70 outputs a feedback signal to the bias circuit 60.

The present crystal oscillator of FIG. 4 initially operates by applying a bias current (i.e., a bias signal) from the output of the bias circuit 60 to the second input of the inverting amplifier 50. Initially, the bias current must be sufficiently large so that the gain of the inverting amplifier 50 will overcome the loss introduced by the crystal 40. This initial bias current depends upon the electrical properties of the inverting amplifier 50 and the crystal 40. Methods of calculating the initial value that should be used for the bias current are well known in the oscillator design art and are beyond the scope of the present invention. The inverting amplifier 50 outputs an inverted amplified oscillation signal, and provides this signal as input to the peak detector circuit 70.

The peak detector circuit 70 samples the inverted amplified oscillation signal and compares it to the reference signal output by the reference circuit 80. The output amplitude of the oscillator can be adjusted by adjusting the level in the reference circuit 80. The peak detector circuit 70 outputs a feedback signal that is input to the bias circuit 60. The peak detector 70 feedback signal is used to adjust the bias current generated by the bias circuit 60.

After comparing the oscillation signal to the reference signal, the peak detector 70 outputs a feedback signal that is used to adjust the bias current when the oscillation signal has not achieved a desired peak amplitude. The peak detector 70 of the present crystal oscillator continues to sample the output of the inverting amplifier 50. The peak detector circuit 70 continually compares the oscillation signal that is output by the inventing amplifier 50 with the reference signal that is output by the reference circuit 80. The peak detector circuit 70 continuously adjusts the bias current until the desired peak amplitude of the oscillation signal is achieved once a desired peak amplitude is achieved, the oscillator is considered to be in a "steady state".

One significant advantage provided by the crystal oscillator described above with reference to FIG. 4 is the bias current generated by the bias circuit 60 can initially be very large without concern over overdriving the crystal oscillator circuit. As is well known in the art, disadvantageously, undesirable excess harmonics in the oscillation signals generated by crystal oscillators are produced when large bias currents are introduced into the oscillators. However, using the inventive crystal oscillator of FIG. 4, risks of overdriving the crystal oscillator circuit are reduced by the amplitude control technique described above. In turn, variations in crystal Q of the crystal 40 can be very large, advantageously permitting use of low cost crystals. Furthermore, by controlling the amplitude as described above with reference to FIG. 4, the risk of overdriving the crystal 40 is also reduced. The reliability of the crystal oscillator is consequently increased. Moreover, by controlling the amplitude (or output level), interference emitted by the crystal oscillator that may affect other sensitive analog blocks is reduced.

FIG. 5 is a more detailed schematic diagram of the preferred embodiment of the present crystal oscillator apparatus, showing more details of the crystal oscillator circuit of FIG. 4. As shown in FIG. 5, the crystal oscillator apparatus of the present invention preferably comprises a crystal circuit 40, an inverting amplifier 50, a bias 60, a peak detector circuit 70, and a reference circuit 80. The crystal circuit 40 comprises a crystal resonator 42 and a pair of capacitors 44, 46. The crystal resonator 42 has a first node and a second node. One node of the capacitor 44 is coupled to the first node of the crystal resonator 42. The other node of the capacitor 44 is coupled to a common ground node 90. Similarly, one node of the capacitor 46 is coupled to the second node of the crystal resonator 42. The other node of the capacitor 46 is coupled to the common ground node 90. Those skilled in the art shall recognize that the crystal 40 can comprise different electrical components and configurations than the preferred embodiment shown in FIG. 5 without departing from the scope of the present invention. For example, an equivalent inductor, resistor and capacitor circuit such as the embodiment described in FIG. 2b can be used to implement the crystal circuit 40 of FIG. 5.

The inverting amplifier 50 preferably comprises an N-MOSFET (M1) 52 and a resistor (R1) 54. The N-MOSFET 53 has three nodes: a drain, a gate and a source. The drain of the N-MOSFET 52 is coupled to a first node of the resistor 54 and the first node of the crystal resonator 42 as shown in FIG. 5. The source of the N-MOSFET 52 is coupled to the common ground 90. The gate of the N-MOSFET 52 is coupled to the other node of the resistor 54 and the second node of the crystal resonator 42. The gate of the N-MOSFET 52 is also coupled to a first node of a capacitor 92. Other alternative inverting amplifier configurations can be used to practice the present invention as long as the inverting amplifier 50 used inverts and amplifies an input signal as described hereinabove. For example, a PMOS or BJT component can be used in the inverting amplifier 50 as an amplifying element.

The bias circuit 60 preferably comprises a step-up transformer (M:1) 62. The step-up transformer 62 outputs a bias current produced by multiplying an input signal (Iout) by M (a constant multiplier that is determined by the characteristics of the transformer). The step-up transformer 62 is coupled to and outputs a bias current to the drain of the N-MOSFET 52. The bias circuit 60 is preferably implemented using the step-up transformer 62. However, this is not meant to limit the present invention as one skilled in the art shall recognize that other methods of producing a bias current, using different electrical component configurations, can be used without departing from the spirit and scope of the present invention.

The peak detector circuit 70 preferably comprises a capacitor (C1) 72, a current source 73, an N-MOSFET (M2) 74, an N-MOSFET (M3) 75, a resistor 76 and a voltage source (V1) 78 coupled together as shown in FIG. 5. The current source 73 produces a reference current (Iref). The N-MOSFETs 74, 75, each have drain, gate and source nodes. One node of the capacitor 72 is coupled to the common ground 90. The other node of the capacitor 72 is coupled to the source of the N-MOSFET 74, the source of the N-MOSFET 75 and the output of the current source 73. The input of the current source 73 is coupled to the common ground 90. The drain of the N-MOSFET 74 is coupled to the input of the step-up transformer 62. The gate of the N-MOSFET 74 is coupled as shown to a first node of the resistor 76 and a node of the capacitor 92. The resistor 76 is coupled to a first node of the voltage source 78 as shown. The second node of the voltage source 78 is coupled to the drain of the N-MOSFET 74 and to an input of the step-up transformer 62. One skilled in the art shall recognize that several peak detector circuit designs and configurations exist and can be used with the present invention as long as the peak detector 70 detects the peak of an input signal and adjusts the bias current in accordance with description provided above.

The reference circuit 80 comprises a voltage source (V2) 82 and a current source 84. The current source 84 outputs an output current (Iout) as shown. A first node of the voltage source 82 is coupled to the gate of the N-MOSFET 75. A second node of the voltage source 82 is coupled as shown to the input of the step-up transformer 62, one node of the voltage source 78, the drain of the N-MOSFET 74 and the input of the current source 84. The output of the current source 84 is coupled to the drain of the N-MOSFET 75. One skilled in the art shall recognize that several configurations exist for implementing the reference circuit 80. These alternative configurations can be used to practice the present invention without departing from the spirit and scope of the present invention.

In one preferred embodiment, a desired effect of the crystal oscillator is to obtain optimal gain over variations in temperature. Thus, the reference circuit 80 comprises a diode electronically coupled to an N-MOSFET biased with a constant current. The voltage drop of the reference circuit 80 "tracks" (i.e., is proportional to) the output signal of the N-MOSFET 52. This is desirable since the amplitude will then track the device characteristics with respect to process and temperature of the gain element 50. In general it is desirable to choose a reference voltage such that it has similar characteristics to the gain element 50.

One skilled in the art shall recognize that other embodiments having different desired effects can be utilized without departing from the scope or spirit of the present invention. For example, a desired effect of increasing the output signal of the N-MOSFET 52 as the temperature increases can be utilized. Alternatively, a desired effect of decreasing the output signal of the N-MOSFET 52 as the temperature increases can be utilized.

The detailed operation of the inventive crystal oscillator of FIG. 5 is now described. The crystal oscillator of FIG. 5 initially operates by applying a bias current (i.e., a bias signal) from the step-up transformer 62 to the drain of the N-MOSFET 52. Initially, the bias current must be sufficiently large so that the gain of the inverting amplifier 50 overcomes the loss introduced by the crystal 40. The bias current generated by the bias circuit 50 causes an inverted amplified oscillation signal to be produced at the gate of the N-MOSFET 52 (i.e., at the output of the inventing amplifier 50). The peak detector 70 samples the inverted amplified oscillation signal that is output from the gate of the N-MOSFET 52. As described above with reference to FIG. 4, the peak detector 70 compares the inverted amplified oscillation signal to the reference signal that is output by the reference circuit 80. The peak detector circuit 70 then outputs a feedback signal that adjusts the bias current accordingly whenever the oscillation signal is not at a desired peak amplitude.

The operation of the peak detector circuit 70 is now described in more detail. Initially, the N-MOSFET 74 is turned off (i.e., does not conduct current) because the voltage drop between the gate and the source (Vgs) of the N-MOSFET 75 is greater than the Vgs of the N-MOSFET 74 (the source of the N-MOSFET 75 and the source of the N-MOSFET 74 are coupled). At this point, the reference current (Iref) is equal to the output current (Iout). The step-up transformer 62 multiplies Iout by M and inputs the resulting current into the drain of the N-MOSFET 52. This causes the amplitude of the oscillation signal to be increased. The oscillation signal is provided as output and is presented at the gate of the N-MOSFET 52.

The amplitude of the oscillation signal generated at the output of the inverting amplifier 50 peaks once a cycle (i.e., one complete oscillation) of the oscillation signal. Eventually, the amplitude of the oscillation signal increases to a peak level whereat the Vgs of the N-MOSFET 74 becomes greater than the Vgs of the N-MOSFET 75. When this occurs, the N-MOSFET 74 briefly turns on (i.e., starts conducting current) and the Iout current starts conducting through the N-MOSFET 74. Thus, the capacitor 72 charges up due to the Iout that is output by the N-MOSFET 74. During non-peak amplitude portions of the cycle, the N-MOSFET 74 is turned off and the Iref slightly discharges the capacitor 72 because the N-MOSFET 75 remains turned on. When the N-MOSFET 75 is slightly turned off the conduction portion of the Iref is produced from discharging the capacitor 72 instead of current flowing through 75. Thus, the Iout that is input to the step-up transformer 62 is reduced. The reduction of Iout continues until the desired peak amplitude occurs and the crystal oscillator of the present invention reaches a steady state.

Advantageously, the peak detector circuit 70 of the preferred embodiment of the present invention operates in a sub-threshold mode of operation (i.e., the MOSFETs act similar to a bipolar device's current and voltage characteristics). As is well known, devices that operate in a sub-threshold mode are very sensitive to changes in current because the current is exponentially proportional to the voltage. These devices can accommodate a wide dynamic range of frequencies and crystal types because small changes in current produce a large changes in voltage across the MOSFET that are operating in sub-threshold mode.

Figure 6:
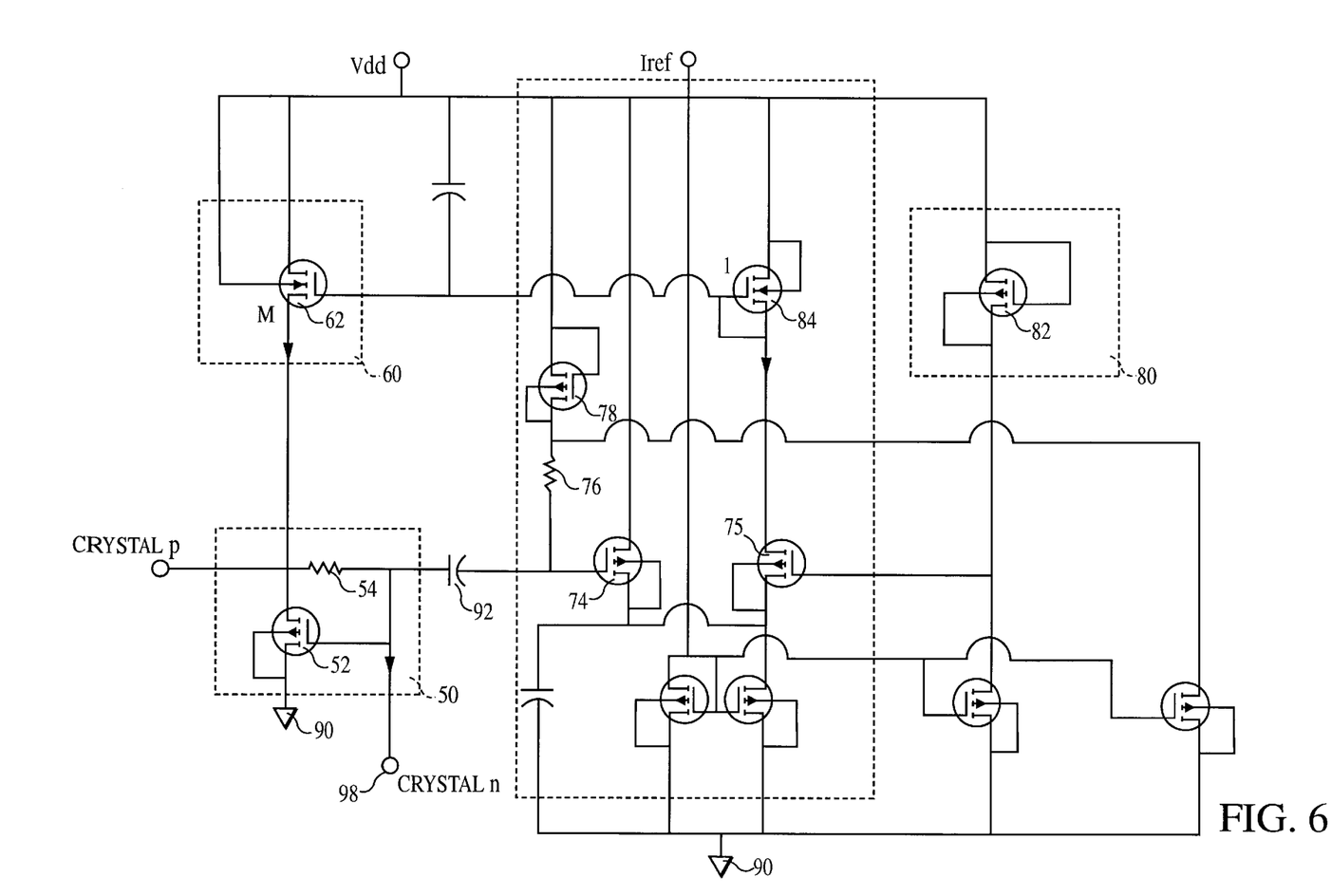
FIG. 6 is a schematic diagram of an exemplary embodiment of the present crystal oscillator apparatus.

FIG. 6 is a detailed schematic diagram of an exemplary implementation of the crystal oscillator apparatus of FIGS. 4 and 5. Those skilled in the oscillator design art shall recognize that the operation and configuration of the crystal oscillator apparatus of FIG. 6 is similar to the description given above with reference to FIGS. 4 and 5. Therefore, the details of the embodiment are not described in detail herein. As shown in FIG. 6, the crystal circuit 40 can be implemented off-chip (not shown) and can, in this configuration, input a signal through a pin 98. The inverting amplifier 50, bias circuit 60, peak detector circuit 70 and reference circuit 80 comprise the configurations of MOSFETs, resistors and capacitors shown in FIG. 5. Advantageously, the exemplary embodiment uses MOSFETs devices. As is well known, when temperature changes occur, the electrical characteristic of the MOSFET devices are changed. As is well known, by implementing the entire oscillator circuit on a single integrated circuit, the oscillator circuit is less affected by variations in temperature. This is the case because all of the MOSFET devices along the signal path are affected similarly by temperature changes. Consequently, the electrical characteristic variation of the MOSFET devices due to temperature changes will tend to cancel each other, and the oscillator circuit will therefore be unaffected by variations in temperature.

A number of embodiments of the present invention have been described. Nevertheless, it will be understood that various modifications may be made without departing from the spirit and scope of the invention. For example, the present inventive method and apparatus can use any type of peak detector as long as it can detect the peak of an input signal and adjust the bias current accordingly. One such example is an N-MOSFET implementation of the peak detector circuit used to practice the present invention. In addition, although examples of the present invention have been described in the context of communication devices, the present invention can be used to implement any device requiring accurate timing. Accordingly, it is to be understood that the invention is not to be limited by the specific illustrated embodiment, but only by the scope of the appended claims.

What is claimed is:

1. A crystal oscillator generating an amplitude controlled crystal oscillator output signal comprising:

a) a crystal resonator circuit having a crystal resonator that generates an oscillation signal having a predetermined oscillation frequency;

b) an inverting amplifier having a first amplifier input, a second amplifier input and an inverting amplifier output, wherein the first amplifier input is coupled to the crystal resonator and receives the oscillation signal, and wherein the inverting amplifier outputs an inverted amplified output signal that is an inverted amplified version of the oscillation signal;

c) a bias circuit having a bias circuit input and a bias circuit output, wherein the bias circuit output generates a bias circuit output signal that is controlled by the bias circuit input, and wherein the bias circuit output signal is coupled to the second amplifier input;

d) a reference circuit generating a reference output signal, wherein the reference output signal is variable and can be set to a predetermined selected reference signal value; and e) a peak detector having a first peak detector input, a second peak detector input and a peak detector output generating a peak detector output signal, wherein the first peak detector input is coupled to receive the inverted amplified output signal, and wherein the second peak detector input is coupled to receive the reference output signal, and wherein the peak detector output is coupled to the bias circuit input, and wherein the peak detector compares the inverted amplified output signal to the reference output signal and adjusts the peak detector output signal until a desired peak amplitude of the inverted amplified output signal is achieved.

2. The crystal oscillator of claim 1, wherein the inverting amplifier, the bias circuit, the reference circuit and the peak detector are implemented on a single integrated circuit, and wherein the crystal resonator circuit is implemented using discrete components that are not implemented on the single integrated circuit.

3. The crystal oscillator of claim 1, wherein the inverting amplifier, the bias circuit, the reference circuit and the peak detector comprise circuits implemented using MOSFETs, resistors and capacitors, and wherein the MOSFETs, resistors and capacitors are all implemented on a single integrated circuit device.

4. The crystal oscillator of claim 1, wherein the crystal resonator circuit comprises a crystal resonator having a first and a second oscillation node, wherein the first oscillation node is coupled to a first capacitor and the second oscillation node is coupled to a second capacitor.

5. The crystal oscillator of claim 4, wherein the inverting amplifier comprises an N-MOSFET device and a resistor, and wherein the N-MOSFET device has a drain, a gate, and a source, and wherein the drain of the N-MOSFET device is coupled to a first node of the resistor, the source is coupled to a common ground, and the gate is coupled to a second node of the resistor, and wherein the first node of the resistor is coupled to the first oscillation node of the crystal resonator, and wherein the second node of the resistor is coupled to the second oscillation node of the crystal resonator.

6. The crystal oscillator of claim 1, wherein the bias circuit comprises a step-up transformer.

7. The crystal oscillator of claim 1, wherein the reference circuit comprises a diode coupled to an N-MOSFET coupled to a constant current source, and wherein the current source outputs a constant current output signal.

8. The crystal oscillator of claim 7, wherein the reference circuit is configured to optimize gain over temperature variations.

9. The crystal oscillator of claim 7, wherein the reference circuit is configured to increase gain when temperature increases.

10. The crystal oscillator of claim 1, wherein the peak detector comprises a capacitor, a current source, a first N-MOSFET device, a second N-MOSFET device, a resistor and a voltage source, and wherein the capacitor is coupled to a common ground, the first N-MOSFET device, the second N-MOSFET device, and the current source, and wherein the current source is coupled to the common ground, the first N-MOSFET device and the second N-MOSFET device, and wherein the first N-MOSFET device is coupled to the resistor, the voltage source and the second N-MOSFET device, and wherein the resistor is coupled to the voltage source.

11. A method of generating an oscillation signal having amplitude control in an electronic device comprising a crystal resonator, an inverting amplifier, a bias source, a reference circuit and a peak detector circuit, the method comprising the steps of:
a) generating an oscillation signal having an oscillation frequency as determined by a crystal resonator, and inputting the desired oscillation signal to an inverting amplifier;
b) applying a bias signal to the inverting amplifier;
c) generating an inverted amplified output signal from the inverting amplifier and inputting the inverted amplified output signal to a first input of a peak detector, wherein the inverted amplified output signal is an inverted amplified version of the oscillation signal;
d) generating a desired reference signal and inputting the reference signal to a second input of the peak detector;
e) comparing the inverted amplified output signal to the reference signal;
f) generating a feedback signal based upon the comparison in step (e), wherein the feedback signal comprises the inverted amplified output signal limited to a desired peak amplitude, and wherein the feedback signal controls the bias signal that is applied to the inverting amplifier in step (b);
g) determining whether the oscillation signal has achieved a steady state; and
h) returning to step (b) until the oscillation signal is determined at step (g) to achieve a steady state.

12. The method of claim 11, wherein the step (a) of generating an oscillation signal comprises applying power to a selected crystal resonator, and wherein the crystal resonator is selected to have predetermined desired electrical characteristics including a desired resonance frequency.

13. The method of claim 11, wherein the bias signal applied to the inverting amplifier in step (b) is sufficiently large such that the inverted amplified output signal generated by the inverting amplifier in step (c) is greater than any loss that may be introduced by the crystal resonator; and wherein the bias signal applied in step (b) is dependent upon electrical properties of the inverting amplifier and the crystal resonator.

14. The method of claim 11, wherein the step (e) of comparing the inverted amplified output signal to the reference signal is implemented using the peak detector, and wherein the peak detector compares the inverted amplified output signal to the reference signal and adjusts the feedback signal generated in step (f) until a desired peak amplitude of the inverted amplified output signal is achieved.

15. A crystal oscillator capable of generating an amplitude controlled crystal oscillator output signal, comprising:
a) means for generating an oscillation signal having a predetermined oscillation frequency;
b) means for generating a bias signal based upon a bias control input;
c) means, coupled to the oscillation signal generating means and the bias signal generating means, for generating an inverted amplified output signal, wherein the inverted amplified output signal is an inverted amplified version of the oscillation signal generated by the oscillation signal generating means;
d) means for generating a variable selected reference signal;
e) means, coupled to the means for generating an inverted amplified output signal and the means for generating the variable selected reference signal, for comparing the inverted amplified output signal with the selected reference signal, wherein the comparing means generates a feedback signal based upon a comparison of the inverted amplified output signal with the reference signal, and wherein the feedback signal is coupled to the bias control input and thereby controls the bias signal generated by the bias signal generating means; and
f) means, coupled to the comparing means, for determining whether the oscillation signal has achieved a steady state.

16. The crystal oscillator of claim 15, wherein the means for generating an oscillation signal comprises a crystal resonator circuit including a crystal resonator coupled to a first and a second capacitor.

17. The crystal oscillator of claim 15, wherein the bias signal generating means comprises a step-up transformer, and wherein the step-up transformer outputs a bias current produced by multiplying an input signal by a constant multiplier as determined by electrical characteristics of the step-up transformer.

18. The crystal oscillator of claim 15, wherein the means for generating an inverted amplified output signal comprises an inverting amplifier, and wherein the inverting amplifier comprises an N-MOSFET device and a resistor, and wherein the N-MOSFET device has a drain, a gate, and a source, and wherein the drain of the N-MOSFET device is coupled to a first node of the resistor, the source is coupled to a common ground, and the gate is coupled to a second node of the resistor, and wherein the first node of the resistor is coupled to the first capacitor that is coupled to the crystal resonator, and wherein the second node of the resistor is coupled to the second capacitor that is coupled to the crystal resonator.

19. The crystal oscillator of claim 15, wherein the means for generating a reference signal comprises a voltage source coupled to a constant current source, and wherein the current source outputs a constant current output signal.

20. The crystal oscillator of claim 15, wherein the means for comparing the inverted amplified output signal with the selected reference signal comprises a peak detector circuit.

21. The crystal oscillator of claim 20, wherein the peak detector circuit comprises a capacitor, a current source, a first N-MOSFET device, a second N-MOSFET device, a resistor and a voltage source, and wherein the capacitor is coupled to a common ground, the first N-MOSFET device, the second N-MOSFET device, and the current source, and wherein the current source is coupled to the common ground, the first N-MOSFET device and the second N-MOSFET device, and wherein the first N-MOSFET device is coupled to the resistor, the voltage source and the second N-MOSFET device, and wherein the resistor is coupled to the voltage source.

\* \* \* \* \*